United States Patent [19]

Allington

[11] 4,188,574
[45] Feb. 12, 1980

[54] AC DETECTOR FOR DC GROUND FAULTS AND HIGH CAPACITANCE IN HIGH-VOLTAGE DC POWER SUPPLIES

[75] Inventor: Robert W. Allington, Lincoln, Nebr.

[73] Assignee: Instrumentation Specialties Company, Lincoln, Nebr.

[21] Appl. No.: 890,071

[22] Filed: Mar. 27, 1978

[51] Int. Cl.² .................................................. G01R 31/02
[52] U.S. Cl. ........................................ 324/51; 340/650
[58] Field of Search .............................. 324/51, 54, 133; 340/646, 649, 650, 651; 361/49, 42; 363/86

[56] References Cited

U.S. PATENT DOCUMENTS

| | | | |
|---|---|---|---|
| 2,999,231 | 9/1961 | Kusters et al. | 324/51 X |
| 3,066,284 | 11/1962 | McKinley et al. | 324/51 X |
| 3,492,567 | 1/1970 | Rissolo | 324/51 |
| 3,737,758 | 6/1973 | Allington | 363/86 |
| 3,757,169 | 9/1973 | Beresnikow | 324/51 X |
| 3,947,759 | 3/1976 | Briggs | 324/51 |
| 3,950,742 | 4/1976 | MacMartin et al. | 340/650 X |
| 3,991,367 | 11/1976 | Chapman et al. | 324/119 X |

Primary Examiner—Gerard R. Strecker
Attorney, Agent, or Firm—Vincent L. Carney

[57] ABSTRACT

A ground fault detector for use in combination with a floating secondary circuit of a direct current high voltage power supply comprising a detector circuit for sensing a relatively low electrical impedance. The existence of a low impedance represents a ground fault current between a part of the secondary circuit of the high voltage power supply and chassis ground to generate an alternating voltage. A rectifying circuit is operatively connected to the detector circuit for rectifying the alternating voltage. A warning indication network is responsive to the rectified alternating voltage for visually indicating the presence of the ground fault current.

11 Claims, 1 Drawing Figure

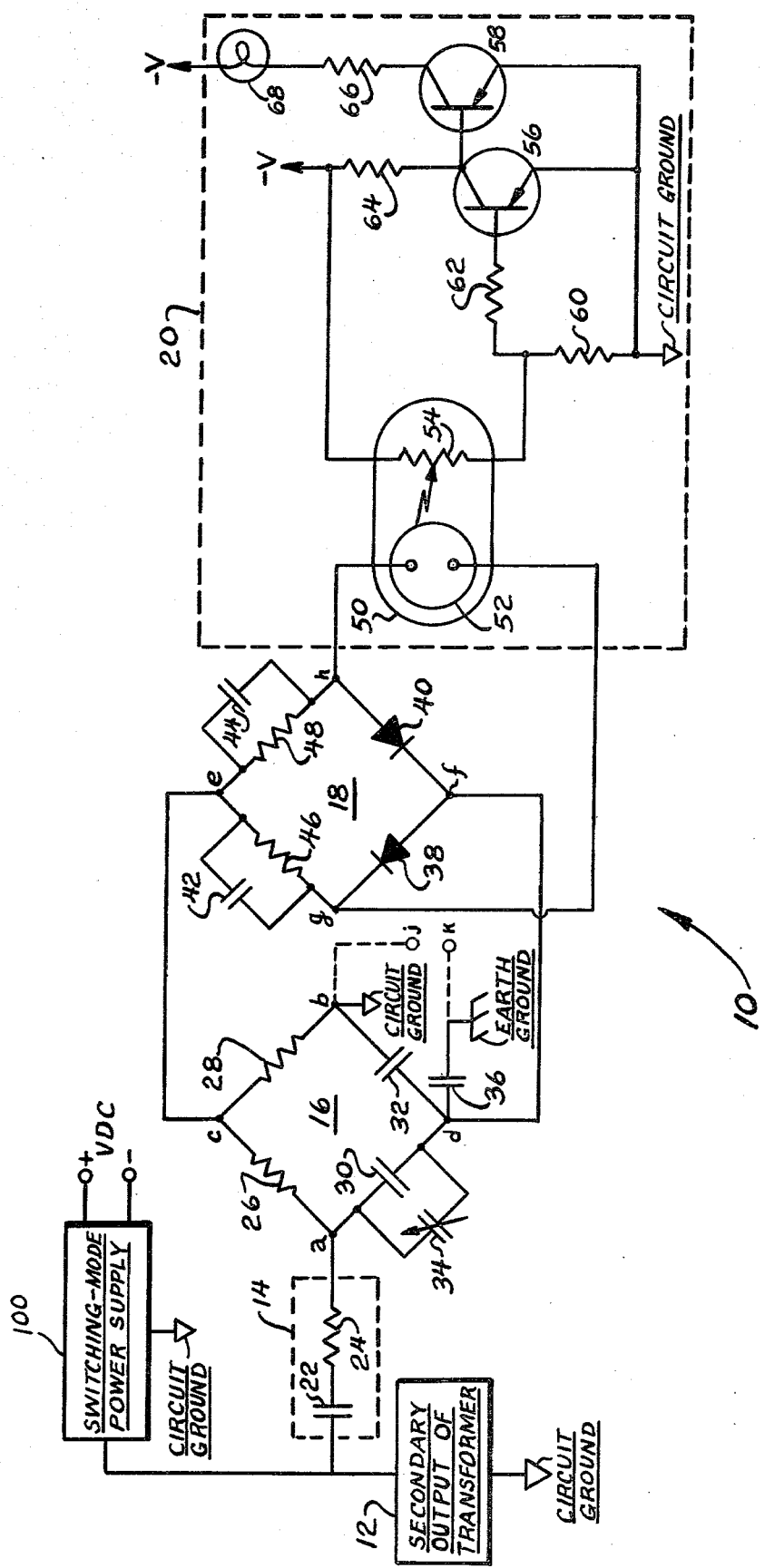

AC DETECTOR FOR DC GROUND FAULTS AND HIGH CAPACITANCE IN HIGH-VOLTAGE DC POWER SUPPLIES

BACKGROUND OF THE INVENTION

This invention relates generally to ground fault detectors for direct current power supplies and more particularly, it relates to a ground fault detector which senses the possibility of direct current leakage or other possible d.c. fault currents by continuously measuring the a.c. electrical impedance between a high voltage d.c. circuit and chassis ground. This ground fault detector has particular applications in "floating" power supplies in which neither the positive nor the negative high voltage output terminal is referenced to chassis ground.

It is generally known in the art that ground fault detectors are utilized in high voltage apparatus to detect or measure leakage currents to ground. Once the leakage current reaches a pre-determined value, there is usually an alarm or warning system which is activated or else the high voltage apparatus is automatically disconnected to prevent a possible hazardous condition to personnel in the area of the apparatus. However, in many situations it would be undesirable to have the high voltage apparatus disconnected. For example, there are numerous laboratory experiments or tests requiring high voltage apparatus in which the voltage may rise during the test. In the ground fault detectors of the prior art, there is sensed the d.c. leakage current instead of an a.c. leakage impedance. Therefore, the alarm system would become activated in the middle of the experiment or test and thus not provide any advance warning at the beginning of the test. An automatic disruption would destroy the results of such experiments or tests. Under these circumstances, it would be more desirable to provide a ground fault detector which can supply a visual warning indication of a potentially dangerous or unsafe condition to personnel in the area at an operating voltage lower than that which could cause a hazardous condition.

Since these prior art d.c. ground fault detectors sense or measure only leakage current, they suffer another disadvantage in that they cannot provide a warning indication due to a dangerously large electrical capacitance which is capable of producing a lethal shock between a d.c. high voltage circuit and earth ground. Thus, it would be desirable to provide a ground fault detector which can detect a condition representing the presence of a potentially dangerous fault current or electrical charge by measuring continuously the a.c. electrical impedance between the d.c. high voltage circuit and earth ground. Once the a.c. electrical impedance decreases to a pre-selected low value, a visual warning indication will become activated.

SUMMARY OF THE INVENTION

Accordingly, it is an object of the present invention to provide a new and improved ground fault detector, but yet overcomes the aforementioned disadvantages.

It is an object of the present invention to provide a ground fault detector for a d.c. power supply which operates independently of the output voltage of the power supply.

It is an object of the present invention to provide a d.c. ground fault detector which can supply a visual warning indication of a potentially dangerous or unsafe condition to personnel in the area, even at d.c. voltage levels which are too low to produce a hazardous condition at the time of the ground fault measurement.

It is an object of the present invention to provide a d.c. ground fault detector which can detect a condition representing the presence of a potentially dangerous ground fault current or electrical charge by measuring continuously the a.c. electrical impedance between a high voltage circuit and earth ground.

In accordance with these aims and objectives, the present invention is concerned with the provision of a d.c. ground fault detector which detects the existence of a ground fault current by measuring continuously the a.c. electrical impedance between a secondary circuit of a high voltage d.c. power supply and earth or chassis ground. Upon the occurrence of an a.c. current representing a ground fault impedance, an alternating voltage is generated which is fed to a rectification circuit. A warning indicator is operatively connected to the rectification circuit for indicating visually the presence of the ground fault current.

Thus, it can be seen that the present invention may be utilized in connection with d.c. high voltage apparatus wherein a visual warning indication is provided upon the occurrence of a ground fault current but the high voltage apparatus is not disconnected. This is particularly effective when it is undesirable to disconnect the high voltage apparatus merely because of a momentary ground fault current since it may ruin, for example, laboratory experiments requiring such high voltage.

The above-stated and other objectives and advantages of the invention will become more apparent from the following detailed description when taken with the accompanying drawing. It will be understood, however, that the drawing is for the purposes of illustration and is not to be construed as defining the scope or limits of the invention, reference being had for the latter purpose to the claims appended hereto.

BRIEF DESCRIPTION OF THE DRAWING

There is shown in the drawing an electrical schematic diagram of the ground fault detector of the instant invention.

DESCRIPTION OF THE PREFERRED EMBODIMENT

The present invention of a ground fault detector has particular applications in connection with "floating" direct current high voltage power supplies. A floating power supply is one in which neither the positive nor the negative voltage output terminal is referenced to chassis or earth ground. The present ground fault detector can be utilized in the secondary circuit of such power supplies to prevent the existence of leakage current between a point in any part of the secondary circuit of the power supply and the chassis ground which would create a potentially dangerous condition.

Referring now to the schematic diagram, there is shown a ground fault detector designated generally by reference numeral 10 comprising a secondary output of transformer 12 of an alternating voltage power source (not shown), an RC filter circuit 14, an electrical impedance bridge 16, a voltage doubler 18, and a warning indicator network 20. The ground fault detector 10 is utilized in conjunction with a switching-mode power supply 100 which provides a high d.c. voltage output. The switching-mode power supply may be of the type described in my U.S. Pat. No. 3,737,758 issued on June 5, 1973 and entitled "Switching-Mode Voltage and Current Regulator."

The secondary output represents a high alternating voltage from a secondary winding of the power transformer. One end of the power source is fed to a capacitor 22 of the filter circuit 14, and the other end of the power source 12 is connected to circuit ground. The filter circuit 14 consists of the capacitor 22 and a resistor 24 having one side coupled to the capacitor 22. The other side of the resistor 24 is coupled to a point "a" of the electrical impedance bridge 16 composed of resistors 26, 28 and capacitors 30, 32. A variable capacitor 34 is connected in parallel with the capacitor 30 for nulling out any initial unbalance in the impedance bridge 16. The point "b" of the electrical impedance bridge 16 is tied to the circuit ground. The capacitor 32 may be largely the unavoidable distributed capacitance naturally existing between the circuit ground and earth ground.

The alternating voltage output of the bridge 16 is provided between the points "c" and "d". The point "d" is also tied to earth or chassis ground via a relatively large capacitor 36. The output of the impedance bridge 16 is coupled to the input points "e" and "f" of the voltage doubler 18 which is comprised of diodes 38, 40; capacitors 42, 44; and resistors 46, 48. The output of the electrical impedance bridge 16 is rectified by the diodes 38, 40 for charging capacitors 42, 44. The output points "g" and "h" of the voltage doubler 18 is connected to an opto-isolator 50 in the warning indicator network 20. The opto-isolator 50 is comprised of a lamp 52 and light-sensitive device 54. The lamp 52 may, for example, be a neon lamp which emits light when current is passed through it. The light-sensitive device 54 may be a photo-cell which conducts current through it when light is received.

The warning indicator network 20 further comprises a pair of transistors 56, 58; resistors 60, 62, 64, 66 associated with the respective transistor 56, 58; and a warning indicator lamp 68. One end of the light-sensitive device 54 is connected to one side of the resistors 60 and 62. The other side of the light-sensitive device 54 is connected to a negative dc power source and one side of the resistor 64. The other side of the resistor 62 is tied to the base of the transistor 56, and the other side of the resistor 64 is tied to the collector of the transistor 56 and the base of transistor 58. The other side of the resistor 60, the emitter of transistor 56, and the emitter of transistor 58 are all coupled to the circuit ground. The resistor 66 is joined between the collector of the transistor 58 and one side of the lamp 68. The other side of the lamp 68 is connected to the negative dc power source.

Under normal operating conditions, there will be no ground fault condition in existence and thus no current will be flowing between points "c" and "d" of the electrical impedance bridge 16. In other words, the impedance bridge will be in a balanced state with alternating-current voltages on the capacitors 30, 34 being equal to the alternating-current voltages on the capacitor 32. In this situation, the voltage doubler 18 does not operate and the lamp 52 of the opto-isolator 50 does not illuminate. Consequently, the light-sensitive device 54 is in the open or non-conducting state thereby maintaining transistor 56 turned off and the transistor 58 turned on. The lamp 68 will thus be conducting continuously through the transistor 58 and remain lighted.

On the other hand, assume that a capacitance greater than a pre-determined value or a resistance less than a pre-determined value is delivered between the chassis ground and a point in the "floating" secondary circuit of the high voltage power supply. For example, a low electrical impedance, which can be either resistive or capacitive, could be connected between a joint "j" shown in phantom representing the circuit ground and a point "k" shown in phantom representing the chassis ground. This creates a condition representing the existence of ground fault current which causes the electrical impedance bridge 16 to become unbalanced. The alternating voltage appearing between the output point "c" and "d" of the impedance bridge will be rectified by the diodes 38, 40, of the voltage doubler 18 to charge the capacitor 42, 44 for flashing the lamp 52 of the opto-isolator 50. This will permit the light-sensitive device 54 to conduct thereby turning off the transistor 56 which, in turn, switches the transistor 58 off to extinguish the lamp 68. Once the voltages on the capacitors 42, 44 have been partially dissipated through the neon lamp 52, the lamp will go off and the light-sensitive device 54 will revert to its non-conducting state thus turning on again transistor 56. This will cause transistor 58 to be turned back on again to illuminate the lamp 68. The cycle of charging and discharging the capacitors 42, 44 is continuously repeated to turn off and on the lamp 68 to give a flashing effect until the ground fault current can be eliminated.

From the above description, it can be seen that the ground fault detector of this invention has the advantages of detecting a condition representing the existence of a ground fault current by continuously measuring the a.c. electrical impedance between a point in the secondary circuit of a direct current high voltage apparatus and chassis ground. Further, upon the detection of such leakage current a visual warning indication is provided but the high voltage apparatus if not disconnected.

Although the preferred embodiment has been described with some particularity, many modifications and variations in this preferred embodiment is possible without deviating from the invention. Accordingly, it is understood that, within the scope of the appended claims, the invention can be practiced otherwise than specifically described.

What is claimed is:

1. The combination of a ground fault detector and a DC power supply comprising:
   a power supply transformer having a primary winding for coupling to an AC power source and a secondary winding;
   said power supply transformer being part of said DC power supply;
   said DC power supply having a floating secondary circuit with a circuit ground and a chassis ground;
   means coupled between said secondary winding and circuit ground and responsive to the AC signal from said secondary winding for detecting a relatively low alternating current impedance between said secondary winding of said transformer and chassis ground; and
   indicator means electrically connected to said means for detecting for providing an indication of said low impedance representing the existence of a ground fault current between a point in the secondary circuit of said DC power supply and chassis ground.

2. The combination of claim 1 in which said means for detecting includes an electrical impedance bridge having a first diagonal including at least a portion of said power supply connected in circuit with circuit ground and a second diagonal including in circuit at least a portion of said indicator means.

3. The combination of claim 2 in which said impedance bridge comprises at least one capacitor in one leg of the bridge; said leg being in circuit with circuit ground at one end and chassis ground through a capacitor at the other end.

4. The combination of claim 3 further comprising a variable capacitor in one leg of said bridge, whereby initial imbalance of the bridge may be cancelled by adjustment of the variable capacitor.

5. The combination of claim 1 in which said means for indicating includes a rectification circuit.

6. The combination of claim 5 in which said rectification circuit includes a voltage doubler.

7. The combination of claim 1 in which said means for indicating includes a lamp.

8. The combination of claim 1 in which said means for indicating includes a warning indicator network.

9. The combination of claim 8 in which said warning indicator network includes an opto-isolator and a lamp in circuit.

10. The combination of claim 8 in which said warning indicator network includes:
 a lamp;
 an opto-isolator; and
 means in circuit with said opto-isolator and lamp for continuously illuminating the lamp when there is no ground fault condition and extinguishing the lamp in response to output pulses of said opto-isolator in response to said rectifier circuit during a fault condition.

11. The combination of claim 1 in which the power supply is of a switching-mode type.

* * * * *